(12) United States Patent
Liu et al.

(10) Patent No.: US 11,127,885 B2
(45) Date of Patent: Sep. 21, 2021

(54) ARRAY SUBSTRATE, DISPLAY PANEL AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventors: Hong Liu, Beijing (CN); Yezhou Fang, Beijing (CN); Fengguo Wang, Beijing (CN); Xinguo Wu, Beijing (CN); Zhixuan Guo, Beijing (CN); Haidong Wang, Beijing (CN); Liang Tian, Beijing (CN); Dong Zhang, Beijing (CN); Yue Yang, Beijing (CN); Yulin Cui, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 27 days.

(21) Appl. No.: 16/826,244

(22) Filed: Mar. 22, 2020

(65) Prior Publication Data
US 2021/0159364 A1    May 27, 2021

(30) Foreign Application Priority Data
Nov. 27, 2019 (CN) .......................... 201922097965.8

(51) Int. Cl.
*H01L 33/38* (2010.01)
*H01L 27/32* (2006.01)
(Continued)

(52) U.S. Cl.
CPC ........ *H01L 33/382* (2013.01); *H01L 27/1248* (2013.01); *H01L 27/3248* (2013.01);
(Continued)

(58) Field of Classification Search
CPC ....... H01L 33/382; H01L 33/56; H01L 33/54; H01L 27/3272; H01L 32/3258; H01L 27/1248; H01L 28/60; H01L 27/32
See application file for complete search history.

(56) References Cited

U.S. PATENT DOCUMENTS

| 2015/0102313 A1* | 4/2015 | Heo ..................... H01L 51/5218 257/40 |
| 2018/0102383 A1* | 4/2018 | Kim ..................... H01L 27/1259 |
| 2020/0105789 A1* | 4/2020 | Fang ................... H01L 27/1259 |

* cited by examiner

*Primary Examiner* — Savitri Mulpuri
(74) *Attorney, Agent, or Firm* — Arent Fox LLP; Michael Fainberg

(57) ABSTRACT

Disclosed are an array substrate, a display panel and a display device. The array substrate includes: a base substrate provided with a bonding region for packaging a chip on film, and a first electrode structure, an interlayer dielectric layer, a second electrode structure and a third electrode structure sequentially arranged on the base substrate, the orthographic projections of the first electrode structure, the interlayer dielectric layer, the second electrode structure and the third electrode structure on the base substrate being located in the bonding region. The array substrate further includes protection layers located between the first portion of the second electrode structure and a third electrode and between the second portion of the second electrode structure and the third electrode respectively; and the protection layers cover the side end face of the first portion and the side end face of the second end surface.

8 Claims, 2 Drawing Sheets

(51) Int. Cl.
*H01L 33/56* (2010.01)
*H01L 33/54* (2010.01)
*H01L 27/12* (2006.01)
*H01L 49/02* (2006.01)

(52) U.S. Cl.
CPC .......... *H01L 27/3272* (2013.01); *H01L 28/60* (2013.01); *H01L 33/54* (2013.01); *H01L 33/56* (2013.01)

ARRAY SUBSTRATE, DISPLAY PANEL AND DISPLAY DEVICE

CROSS REFERENCE TO RELATED APPLICATION

This application claims priority to Chinese Patent Application No. 201922097965.8, filed with the Chinese Patent Office on Nov. 27, 2019. The entire disclosure of the above application is incorporated herein by reference.

FIELD

The present disclosure relates to the technical field of display, in particular to an array substrate, a display panel and a display device.

BACKGROUND

The chip on film package process is one important part in the popular full-screen technology. Signal transmission for each PIN output of a bonding region is realized by the stack patterns of a Gate (gate), a CNT (interlayer dielectric layer), a SD (source-drain metal) and a P-ITO (pixel electrode).

SUMMARY

The present disclosure provides an array substrate, which includes:

a base substrate provided with a bonding region for packaging a chip on film;

a first electrode structure, an interlayer dielectric layer, a second electrode structure and a third electrode structure sequentially arranged in that order on the base substrate, the orthographic projections of the first electrode structure, the interlayer dielectric layer, the second electrode structure and the third electrode structure on the base substrate being located in the bonding region, where:

a via hole is formed in the interlayer dielectric layer, and the interlayer dielectric layer includes a first dielectric subsection and a second dielectric subsection which are located at the two sides of the via hole respectively;

the second electrode structure includes a first portion and a second portion, the orthographic projections of the first portion and the second portion are not located in the via hole, the first portion partially covers the first dielectric subsection, the orthographic projection of the first portion on the base substrate is located within the orthographic projection of the first dielectric subsection on the base substrate; and the second portion partially covers the second dielectric subsection, and the orthographic projection of the second portion on the base substrate is located within the orthographic projection of the second dielectric subsection on the base substrate; and the array substrate further includes protection layers disposed between the first portion and a third electrode and between the second portion and the third electrode respectively, the protection layers cover the side end face of the first portion and the side end face of the second portion, the orthographic projections of the protection layers on the base substrate are located within the orthographic projections of the first dielectric subsection and the second dielectric subsection on the base substrate.

In some embodiments, the first electrode structure is in contact connection with the second electrode structure through the via hole of the interlayer dielectric layer, and a portion, not in contact with the second electrode structure, of the first electrode structure is covered with the first dielectric subsection and the second dielectric subsection.

In some embodiments, the base substrate includes a display region, and the second electrode structure and a drain-source structure of a thin film transistor of the display region of the base substrate are made of the same material.

In some embodiments, the second electrode structure includes an aluminum metal layer.

In some embodiments, the first electrode structure and a gate of the thin film transistor in the display region of the base substrate are made of the same material.

In some embodiments, the third electrode structure and a pixel electrode in the display region of the base substrate are made of the same material.

In some embodiments, the second electrode structure further includes a first titanium metal layer disposed on the side, facing the first electrode structure, of the aluminum metal layer, and a second titanium metal layer disposed on the side, facing away from the first titanium metal layer, of the aluminum metal layer.

In some embodiments, the protection layers are made of an insulating material.

In some embodiments, the thin film transistor of the display region is covered with a planarization layer, and the protection layers are made of the same material as the planarization layer.

In some embodiments, the thickness of the protection layer is 1.5-3 µm.

The present disclosure also provides a display panel including a display substrate, which includes:

a base substrate provided with a bonding region for packaging a chip on film;

a first electrode structure, an interlayer dielectric layer, a second electrode structure and a third electrode structure sequentially arranged in that order on the base substrate, the orthographic projections of the first electrode structure, the interlayer dielectric layer, the second electrode structure and the third electrode structure on the base substrate being located in the bonding region, where:

a via hole is formed in the interlayer dielectric layer, and the interlayer dielectric layer includes a first dielectric subsection and a second dielectric subsection which are located at the two sides of the via hole respectively;

the second electrode structure includes a first portion and a second portion, the orthographic projections of the first portion and the second portion are not located in the via hole, the first portion partially covers the first dielectric subsection, the orthographic projection of the first portion on the base substrate is located within the orthographic projection of the first dielectric subsection on the base substrate; and the second portion partially covers the second dielectric subsection, and the orthographic projection of the second portion on the base substrate is located within the orthographic projection of the second dielectric subsection on the base substrate; and the array substrate further includes protection layers disposed between the first portion and a third electrode and between the second portion and the third electrode respectively, the protection layers cover the side end face of the first portion and the side end face of the second portion, the orthographic projections of the protection layers on the base substrate are located within the orthographic projections of the first dielectric subsection and the second dielectric subsection on the base substrate.

The present disclosure also provides a display device including the display panel described above.

DETAILED DESCRIPTION OF THE EMBODIMENTS

The technical solutions in the embodiments of the present disclosure will be clearly and completely described below with reference to the accompanying drawings in the embodiments of the present disclosure. Obviously, the described embodiments are only a part of the embodiments of the present disclosure, but not all of the embodiments. All other embodiments obtained by those of ordinary skill in the art without creative efforts based on the embodiments according to the present disclosure fall within the protection scope of the present disclosure.

In the related art, an exposed portion of the source and drain metal in a PIN region will be etched by a planarization layer developing solution and a common electrode etching solution, consequently, aluminum in a source and drain metal layer is etched, the source and drain metal film layers on the two sides are peeling, effective bonding with an upper film layer and the contact resistance are affected, defective rate up to 3% of lighting pictures may be caused.

Figure 1:
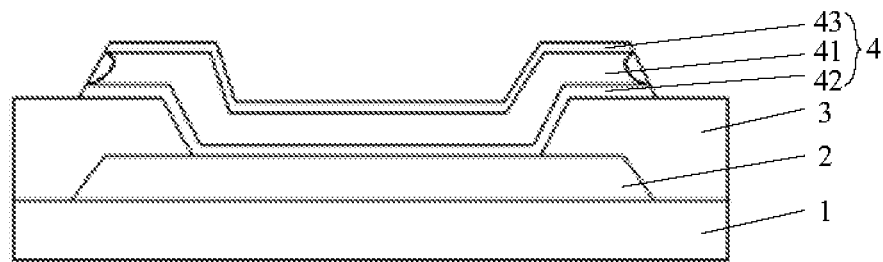
FIG. 1 is a schematic structural diagram of an array substrate in a bonding region in the related art.

For example, in related art, as shown in FIG. 1, metal on the pattern edge of the second electrode structure 4 in an array substrate is exposed, in the subsequent preparation process, the part will be etched by the planarization developing solution and the common electrode structure etching solution, as a result, aluminum in the metal is etched, and a metal film layer at the edge is peeling.

Figure 2:
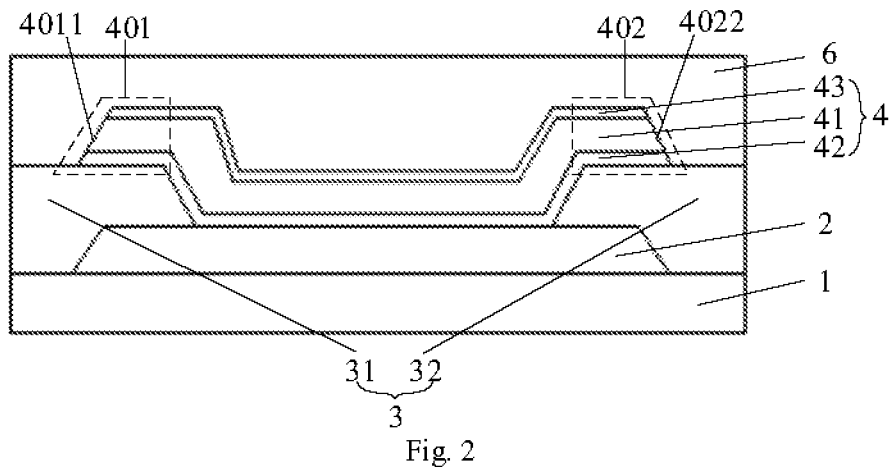
FIG. 2 is a schematic structural diagram illustrating the exposure of a planarization layer in the bonding region using a half tone mask according to the present disclosure.
Figure 3:
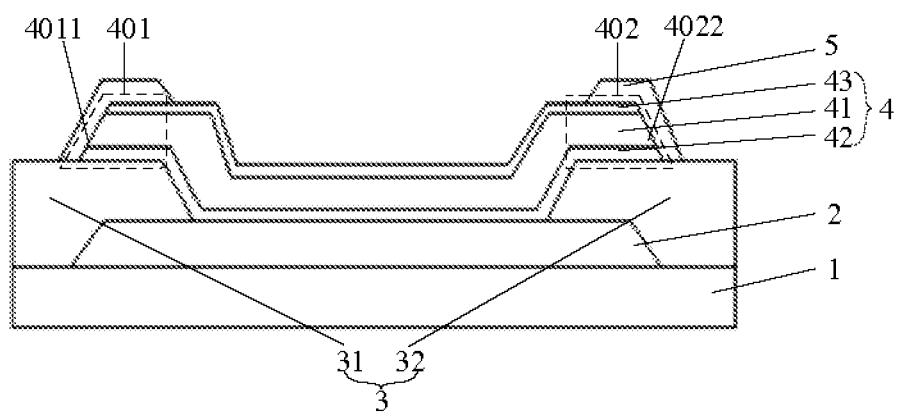
FIG. 3 is a schematic structural diagram of development using a half tone mask of a planarization layer in the bonding region according to the present disclosure.
Figure 4:
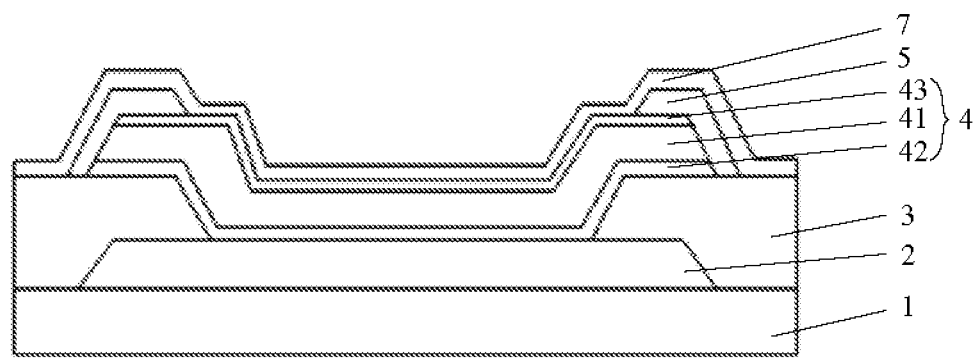
FIG. 4 is a cross view of an array substrate in the bonding region according to the present disclosure.

Based on this, the present disclosure provides an array substrate, referring to FIGS. 2-4, the array substrate includes: a base substrate 1 including a bonding region for packaging a chip on film, and a first electrode structure 2, an interlayer dielectric layer 3, a second electrode structure 4 and a third electrode structure 7 arranged in that order on the base substrate 1, the orthographic projections of the first electrode structure 2, the interlayer dielectric layer 3, the second electrode structure 4 and the third electrode structure 7 on the base substrate 1 being located in the bonding region. The interlayer dielectric layer 3 is provided with a via hole, and includes a first dielectric subsection 31 and a second dielectric subsection 32 which are located at the two sides of the via hole respectively; the second electrode structure 4 includes a first portion 401 and a second portion 402, the orthographic projections of the first portion 401 and the second portion 402 on the base substrate 1 are not located in the via hole, the first portion 401 partially covers the first dielectric subsection 31, and the orthographic projection of the first portion 401 on the base substrate 1 is located in the orthographic projection of the first dielectric subsection 31 on the base substrate 1; the second portion 402 partially covers the second dielectric subsection 32, and the orthographic projection of the second portion 402 on base substrate 1 is located in the orthographic projection of the second dielectric subsection 32 on the base substrate. The array substrate further includes protection layers 5 located between the first portion 401 and a third electrode 7 and between the second portion 402 and the third electrode 7 respectively. The protection layers 5 cover a side end face 4011 of the first portion 401 and a side end face 4022 of the second portion 402, where the orthographic projections of the protection layers 5 on the base substrate are located in the orthographic projections of the first dielectric subsection 31 and the second dielectric subsection 32 on the base substrate respectively.

It should be noted that according to the present disclosure, the side end faces of the first portion and the second portion of the second electrode structure of the array substrate refer to surfaces of the second electrode structure which do not face the stacking direction of the array substrate.

In the embodiment of the present disclosure, the protection layers 5 are disposed on the second electrode structure 4. The protection layers 5 can cover the exposed side end faces of the first portion and the second portion of the electrode structure 4, thus, metal on the side end faces is not etched by a planarization developing solution and a common electrode structure etching solution, and then the second electrode structure is prevented from peeling.

In some embodiments, the first electrode structure 2 is in contact connection with the second electrode structure 4 through the via hole of the interlayer dielectric layer, and a portion, not in contact with the second electrode structure 4, of the first electrode structure 1 is covered with the first dielectric subsection 31 and the second dielectric subsection 32.

In some embodiments, the base substrate includes a display region, and the second electrode structure 4 and a drain-source structure of a thin film transistor of the display region of the base substrate are made of the same material.

In some embodiments, the second electrode structure 4 may be prepared in the same layer as the source-drain structure of the thin film transistor, that is, the second electrode structure is prepared while the drain-source structure of the thin film transistor is prepared.

In some embodiments, the second electrode structure includes an aluminum metal layer 41.

In some embodiments, the first electrode structure 2 is prepared in the same layer as a gate of the thin film transistor in the display region of the base substrate 1, that is, the first electrode structure 2 is prepared while the gate of the thin film transistor is prepared.

In some embodiments, the third electrode structure 7 is prepared in the same layer as a pixel electrode in the display region of the base substrate 1, that is, the third electrode structure 7 is prepared while the pixel electrode is prepared, so that the preparation process is simplified.

In some embodiments, the second electrode structure 4 further includes a first titanium metal layer 42 disposed on the side, facing the first electrode structure 2, of the aluminum metal layer 41, and a second titanium metal layer 43 disposed on the side, facing away from the first titanium metal layer 42, of the aluminum metal layer 41.

In some embodiments, the protection layers 5 may be made of an insulating material. As an optional method, the protection layers 5 according to the present disclosure may be made in the same layer as a planarization layer covering the thin film transistor of the display region of the base substrate, that is, a planarization layer 6 covering the second electrode structure is also formed on the second electrode structure 4 in the bonding region.

Figure 5A:
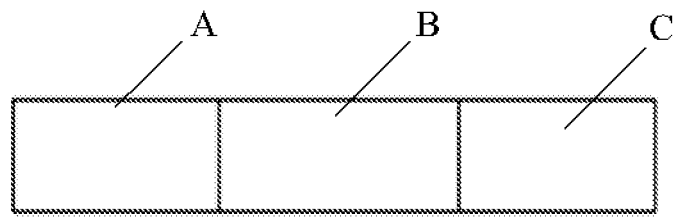
FIG. 5A is a schematic structural diagram of a half tone mask according to the present disclosure.
Figure 5B:
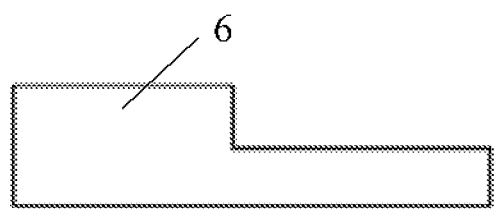
FIG. 5B is schematic structural diagram after development using a half tone mask according to the present disclosure.

Further, a half tone mask is adopted for preparing the planarization layer 6 into the protection layers 5 covering the exposed end surface of the second electrode structure 4. As shown in FIG. 5A and FIG. 5B, the half tone mask is divided into three regions: a blocking region A, a semi-transparent region B and a transparent region C; where the blocking region A corresponds to a planarization layer covering the thin film transistor of the display region, the semi-transparent region B corresponds to a protection region in which the protection layers 5 are located, and the transparent region C corresponds to an opening region including pixels and other regions. In some embodiments, the process of preparing the planarization layer 6 and the protection layers 5 may be implemented by processes of glue application, exposure, development and curing.

The half tone mask is adopted by the disclosure to prepare the protection layers, the profile of the end surfaces of the two sides of the second electrode structure 4 can be modified, therefore, a better bonding effect with other film layers is achieved, and the problem of poor screen caused by aluminum corrosion is further solved.

In some embodiments, the thickness of the protection layer 5 may be 1.5-3 μm.

Based on the same inventive idea, the present disclosure also provides a display panel including the above-mentioned array substrate. Since the metal on the end faces of the second electrode structure 4 of the array substrate is not etched, display screens of the display panel can be guaranteed.

Similarly, based on the same inventive idea, the present disclosure also provides a display device including the above display panel.

Obviously, those skilled in the art can make various modifications and variations to the embodiments of the present disclosure without departing from the spirit and scope of the present disclosure. In this way, if these modifications and variations of the present disclosure fall within the scope of the claims of the present disclosure and the equivalent technologies, the present disclosure also intends to include these modifications and variations.

The invention claimed is:

1. An array substrate, comprising:
a base substrate comprising a bonding region for packaging a chip on film; and
a first electrode structure, an interlayer dielectric layer, a second electrode structure and a third electrode structure arranged in that order on the base substrate, orthographic projections of the first electrode structure, the interlayer dielectric layer, the second electrode structure and the third electrode structure on the base substrate being located in the bonding region, wherein:
a via hole is formed in the interlayer dielectric layer, and the interlayer dielectric layer comprises a first dielectric subsection and a second dielectric subsection which are located at two sides of the via hole respectively;
the second electrode structure comprises a first portion and a second portion, orthographic projections of the first portion and the second portion are not located in the via hole, the first portion partially covers the first dielectric subsection, orthographic projection of the first portion on the base substrate is located in the orthographic projection of the first dielectric subsection on the base substrate; and the second portion partially covers the second dielectric subsection, and orthographic projection of the second portion on the base substrate is located in the orthographic projection of the second dielectric subsection on the base substrate; and
the array substrate further comprises protection layers disposed between the first portion and a third electrode and between the second portion and the third electrode respectively, the protection layers cover a side end face of the first portion and a side end face of the second portion, orthographic projections of the protection layers on the base substrate are located within the orthographic projections of the first dielectric subsection and the second dielectric subsection on the base substrate;
wherein the first electrode structure is in contact connection with the second electrode structure through the via hole of the interlayer dielectric layer, and a portion, not in contact with the second electrode structure, of the first electrode structure is covered with the first dielectric subsection and the second dielectric subsection;
wherein the base substrate comprises a display region, and the second electrode structure and a drain-source structure of a thin film transistor in the display region of the base substrate are made of a same material;
wherein the first electrode structure and a gate of the thin film transistor in the display region of the base substrate are made of a same material;
wherein the third electrode structure and a pixel electrode in the display region of the base substrate are made of a same material.

2. The array substrate according to claim 1, wherein the second electrode structure comprises an aluminum metal layer.

3. The array substrate according to claim 2, wherein the second electrode structure further comprises a first titanium metal layer disposed on a side, facing the first electrode structure, of the aluminum metal layer, and a second titanium metal layer disposed on the side, facing away from the first titanium metal layer, of the aluminum metal layer.

4. The array substrate according to claim 1, wherein the protection layers are made of an insulating material.

5. The array substrate according to claim 1, wherein the thin film transistor in the display region is covered with a planarization layer, and the protection layers are made of a same material as the planarization layer.

6. The array substrate according to claim 1, wherein the thickness of the protection layer is 1.5-3 μm.

7. A display panel, comprising the array substrate, wherein the array substrate comprises:
a base substrate comprising a bonding region for packaging a chip on film; and
a first electrode structure, an interlayer dielectric layer, a second electrode structure and a third electrode structure arranged in that order on the base substrate, orthographic projections of the first electrode structure, the interlayer dielectric layer, the second electrode structure and the third electrode structure on the base substrate being located in the bonding region, wherein:
a via hole is formed in the interlayer dielectric layer, and the interlayer dielectric layer comprises a first dielectric subsection and a second dielectric subsection which are located at two sides of the via hole respectively;
the second electrode structure comprises a first portion and a second portion, orthographic projections of the first portion and the second portion are not located in the via hole, the first portion partially covers the first dielectric subsection, orthographic projection of the first portion on the base substrate is located in the orthographic projection of the first dielectric subsection on the base substrate; and the second portion partially covers the second dielectric subsection, and orthographic projection of the second portion on the base substrate is located in the orthographic projection of the second dielectric subsection on the base substrate; and the array substrate further comprises protection layers disposed between the first portion and a third electrode and between the second portion and the third electrode respectively, the protection layers cover a side end face of the first portion and a side end face of the second portion, orthographic projections of the protection layers on the base substrate are located within the orthographic projections of the first dielectric subsection and the second dielectric subsection on the base substrate;

wherein the first electrode structure is in contact connection with the second electrode structure through the via hole of the interlayer dielectric layer, and a portion, not in contact with the second electrode structure, of the first electrode structure is covered with the first dielectric subsection and the second dielectric subsection;

wherein the base substrate comprises a display region, and the second electrode structure and a drain-source structure of a thin film transistor in the display region of the base substrate are made of a same material;

wherein the first electrode structure and a gate of the thin film transistor in the display region of the base substrate are made of a same material;

wherein the third electrode structure and a pixel electrode in the display region of the base substrate are made of a same material.

8. A display device, comprising the display panel according to claim 7.

* * * * *